(12) United States Patent
Akarvardar et al.

(10) Patent No.: US 9,530,869 B2
(45) Date of Patent: Dec. 27, 2016

(54) METHODS OF FORMING EMBEDDED SOURCE/DRAIN REGIONS ON FINFET DEVICES

(71) Applicant: GLOBALFOUNDRIES Inc., Grand Cayman (KY)

(72) Inventors: Murat Kerem Akarvardar, Saratoga Springs, NY (US); Jody A. Fronheiser, Delmar, NY (US); Steven Bentley, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 133 days.

(21) Appl. No.: 14/643,409

(22) Filed: Mar. 10, 2015

(65) Prior Publication Data

US 2016/0268399 A1 Sep. 15, 2016

(51) Int. Cl.
| | |
|---|---|
| *H01L 29/66* | (2006.01) |
| *H01L 21/311* | (2006.01) |
| *H01L 21/306* | (2006.01) |
| *H01L 21/3105* | (2006.01) |
| *H01L 21/02* | (2006.01) |
| *H01L 29/78* | (2006.01) |
| *H01L 29/08* | (2006.01) |

(52) U.S. Cl.
CPC ... *H01L 29/66795* (2013.01); *H01L 21/02164* (2013.01); *H01L 21/02636* (2013.01); *H01L 21/30604* (2013.01); *H01L 21/31051* (2013.01); *H01L 21/31111* (2013.01); *H01L 29/0847* (2013.01); *H01L 29/66636* (2013.01); *H01L 29/7848* (2013.01)

(58) Field of Classification Search
CPC ............... H01L 29/78; H01L 29/66795; H01L 29/66636; H01L 29/7848
See application file for complete search history.

(56) References Cited

U.S. PATENT DOCUMENTS

| | | | | |
|---|---|---|---|---|
| 2011/0193141 A1* | 8/2011 | Lin | ....................... | H01L 29/045 257/255 |
| 2014/0110755 A1* | 4/2014 | Colinge | ............ | H01L 29/41791 257/192 |
| 2015/0035017 A1* | 2/2015 | Wann | ..................... | H01L 29/785 257/288 |
| 2015/0187571 A1* | 7/2015 | Fan | ..................... | H01L 29/0653 257/401 |
| 2016/0064483 A1* | 3/2016 | Kelly | .................. | H01L 29/0847 257/401 |

* cited by examiner

*Primary Examiner* — Errol Fernandes
(74) *Attorney, Agent, or Firm* — Amerson Law Firm, PLLC

(57) ABSTRACT

One illustrative method disclosed herein includes, among other things, forming a layer of insulating material in the source/drain regions of the device, wherein the layer of insulating material has an upper surface that is substantially planar with an upper surface of a gate cap layer, recessing the layer of insulating material such that its recessed upper surface exposes a surface of the fin, performing another etching process to remove at least a portion of the fin and thereby define a recessed fin trench positioned above the recessed fin, and forming an epitaxial semiconductor material that is at least partially positioned in the recessed fin trench.

22 Claims, 13 Drawing Sheets

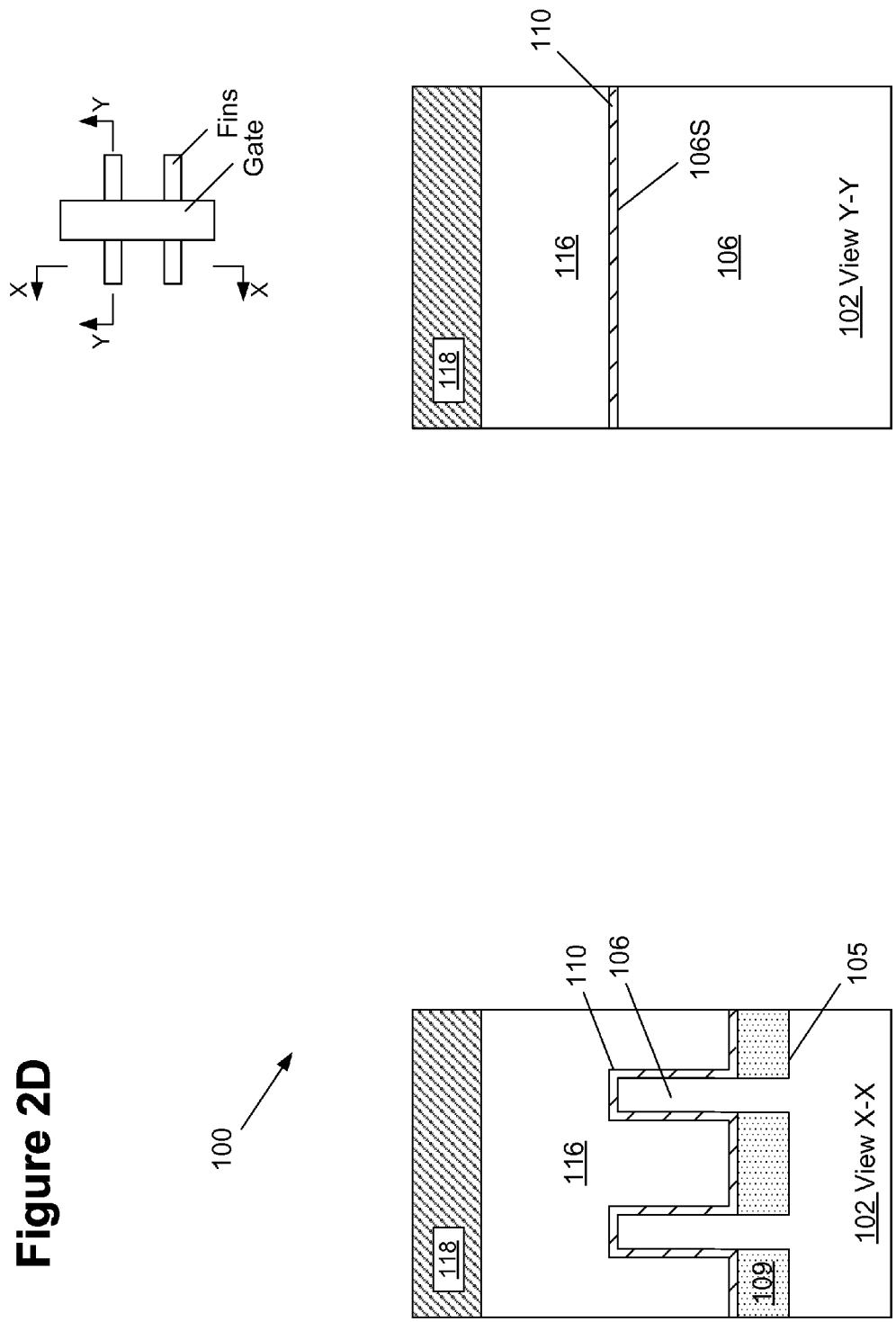

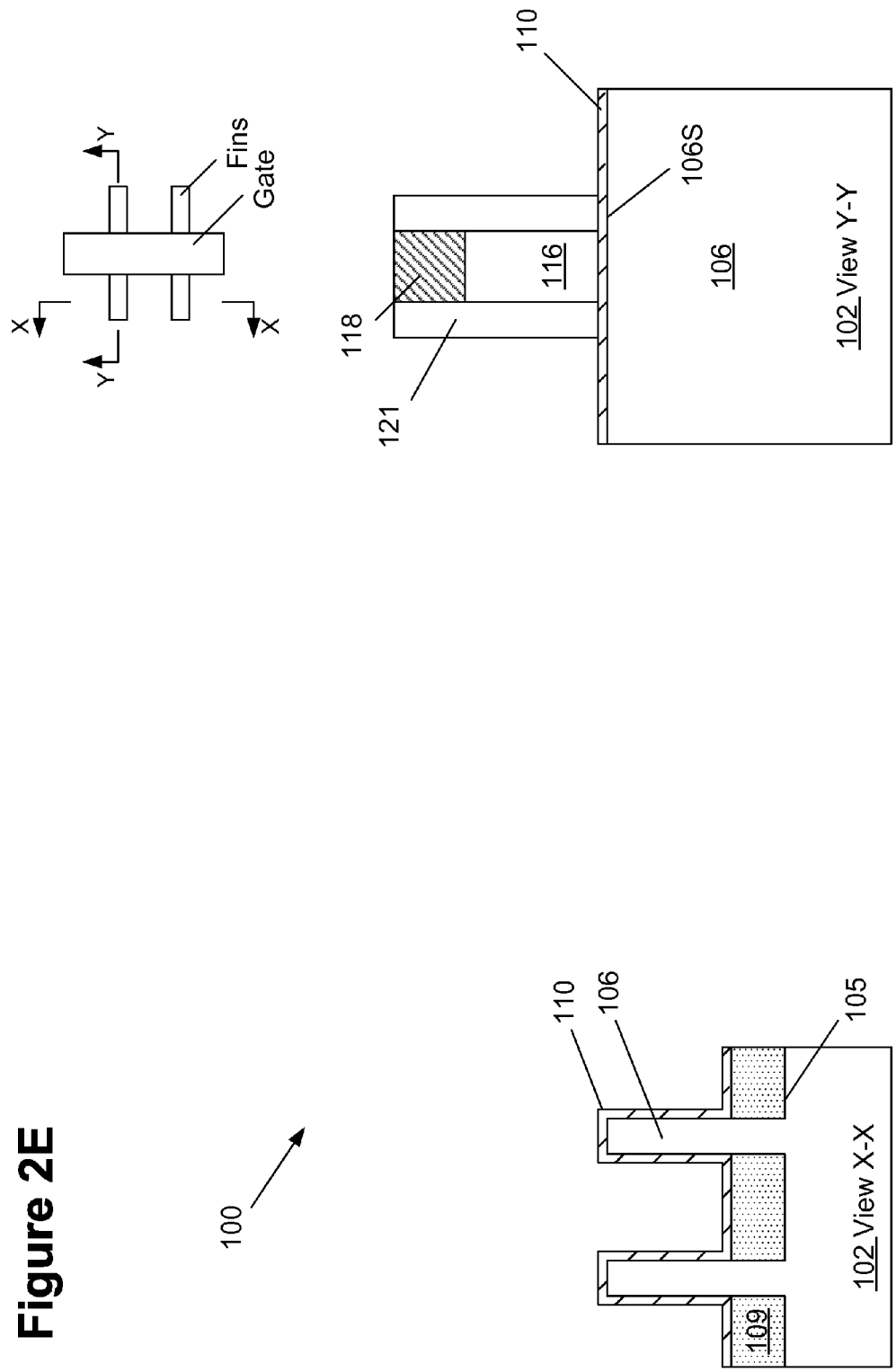

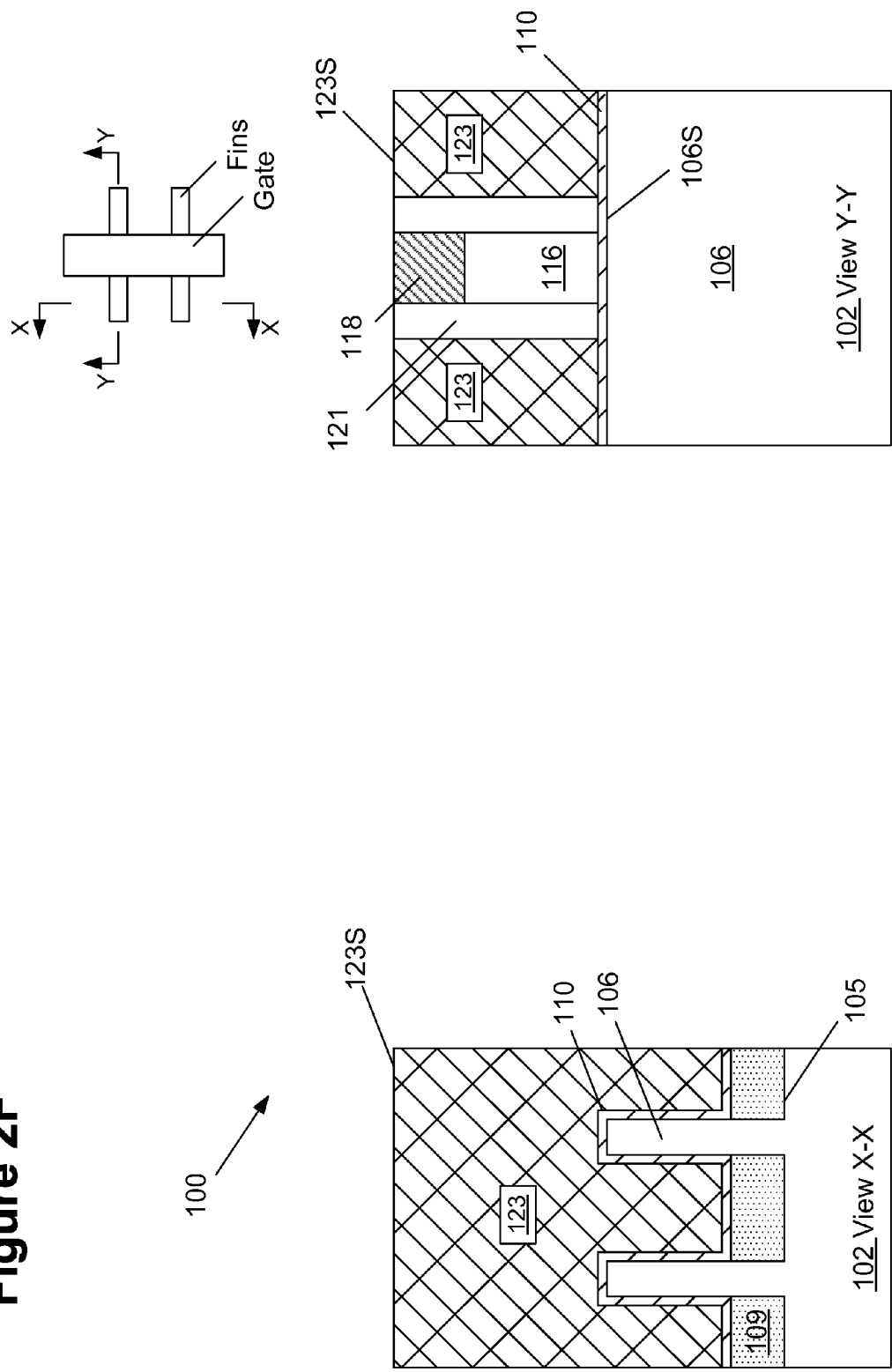

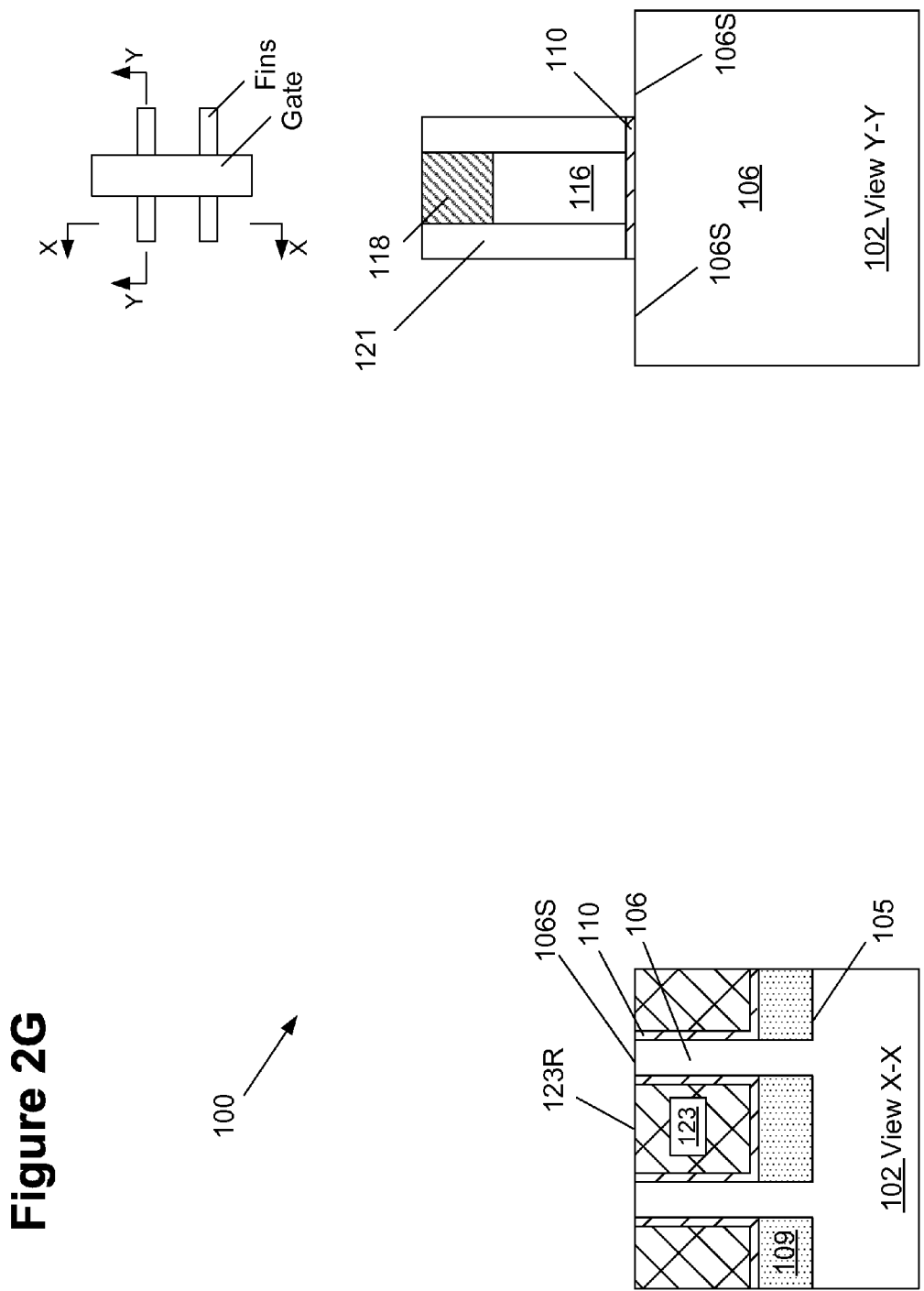

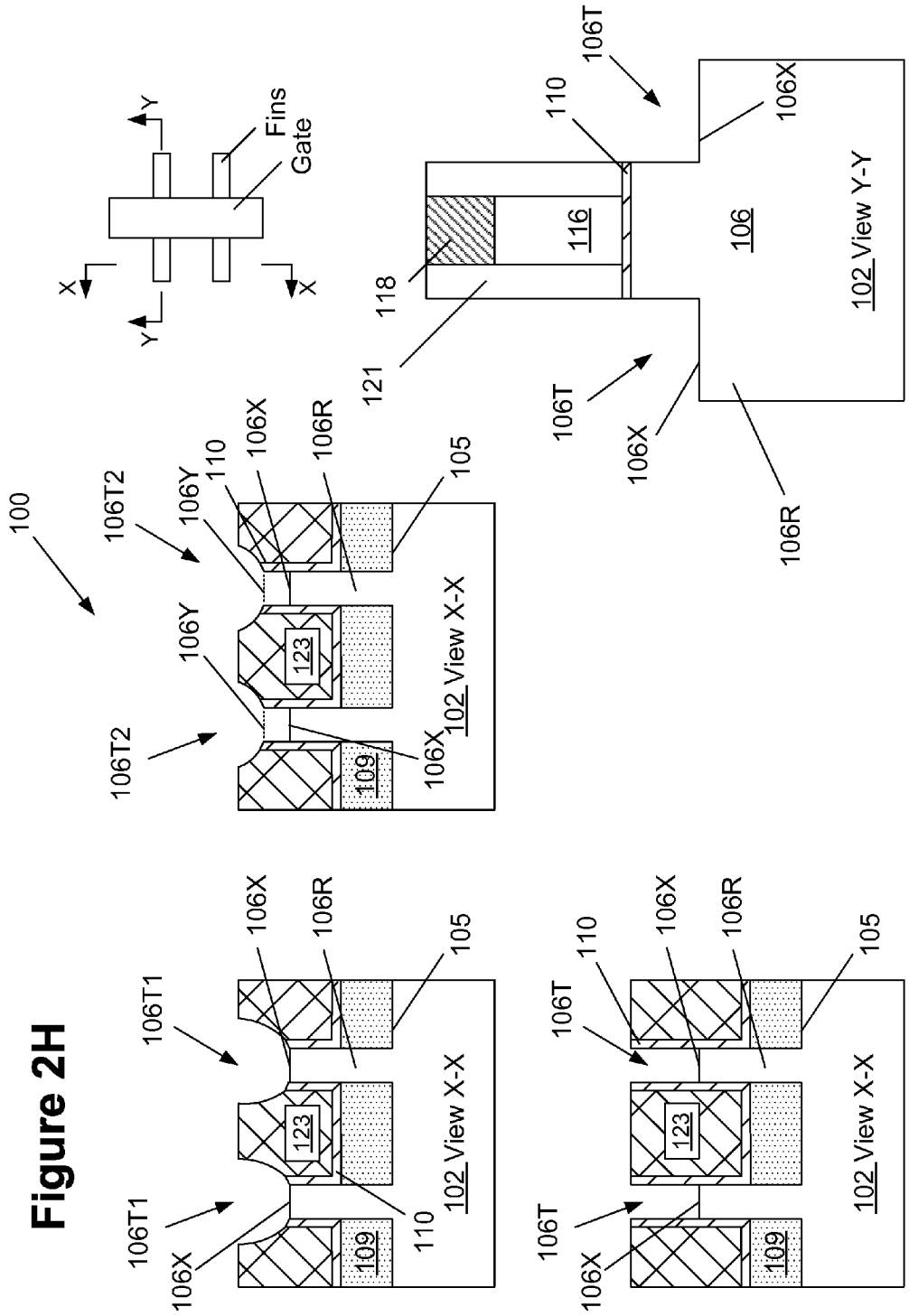

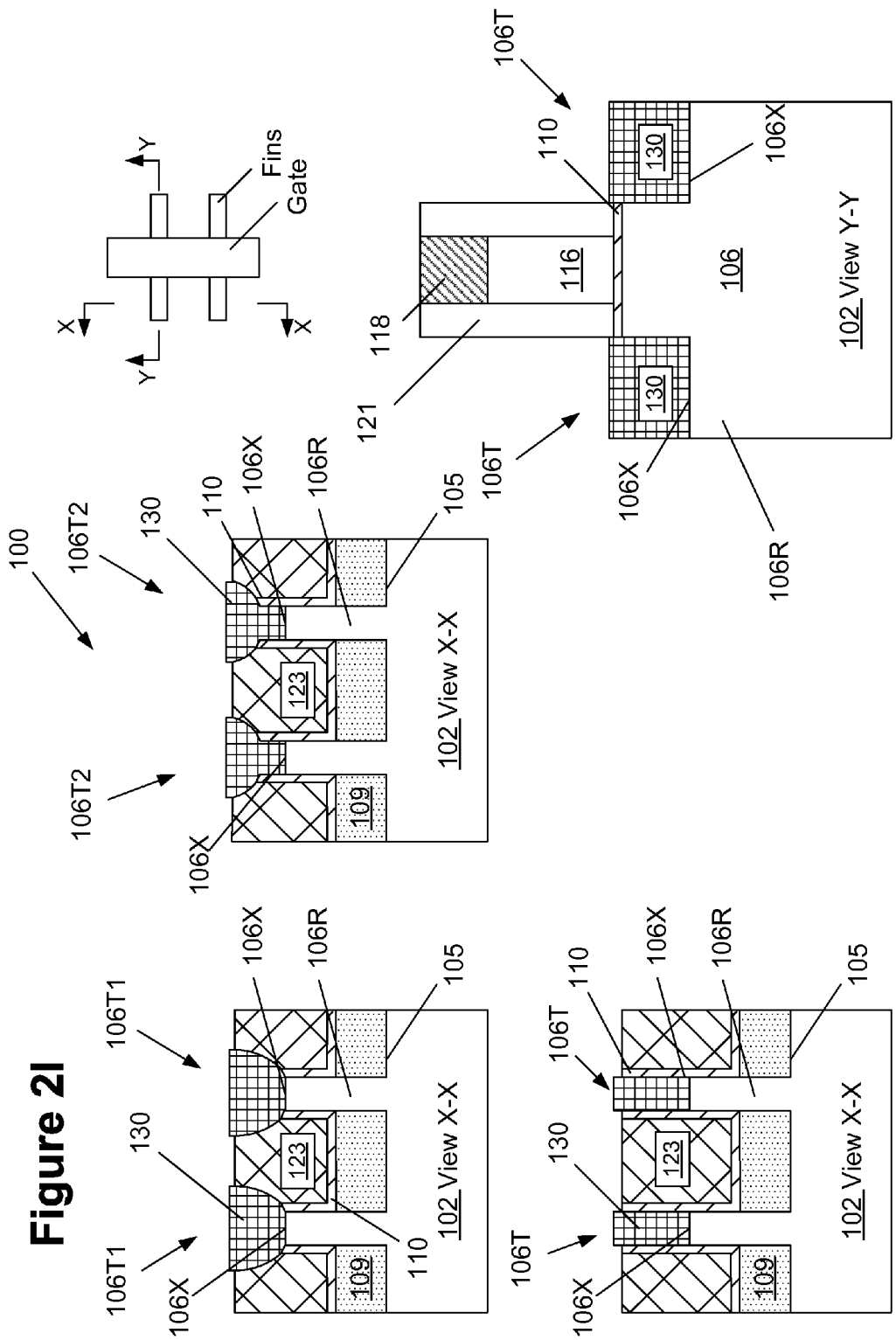

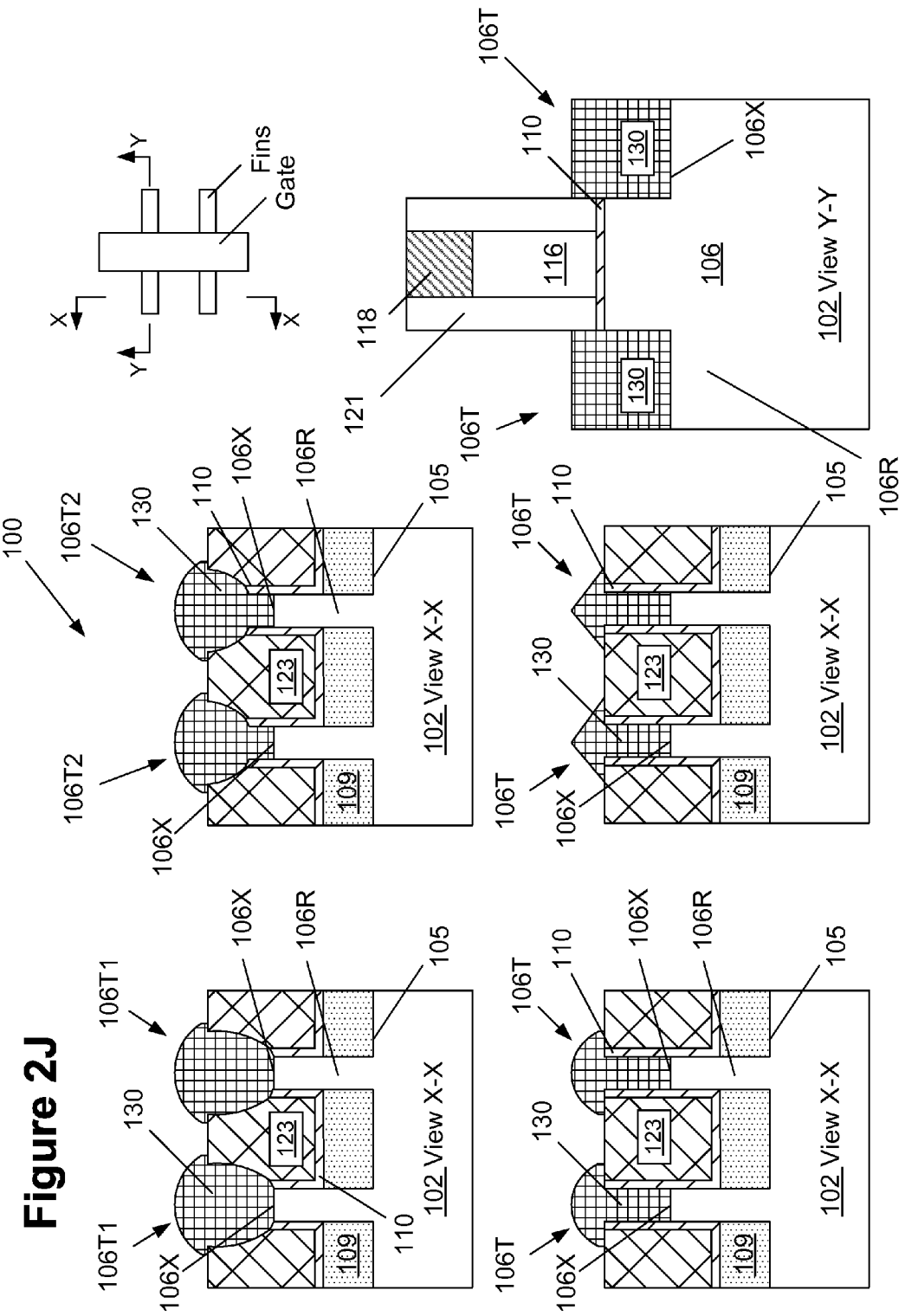

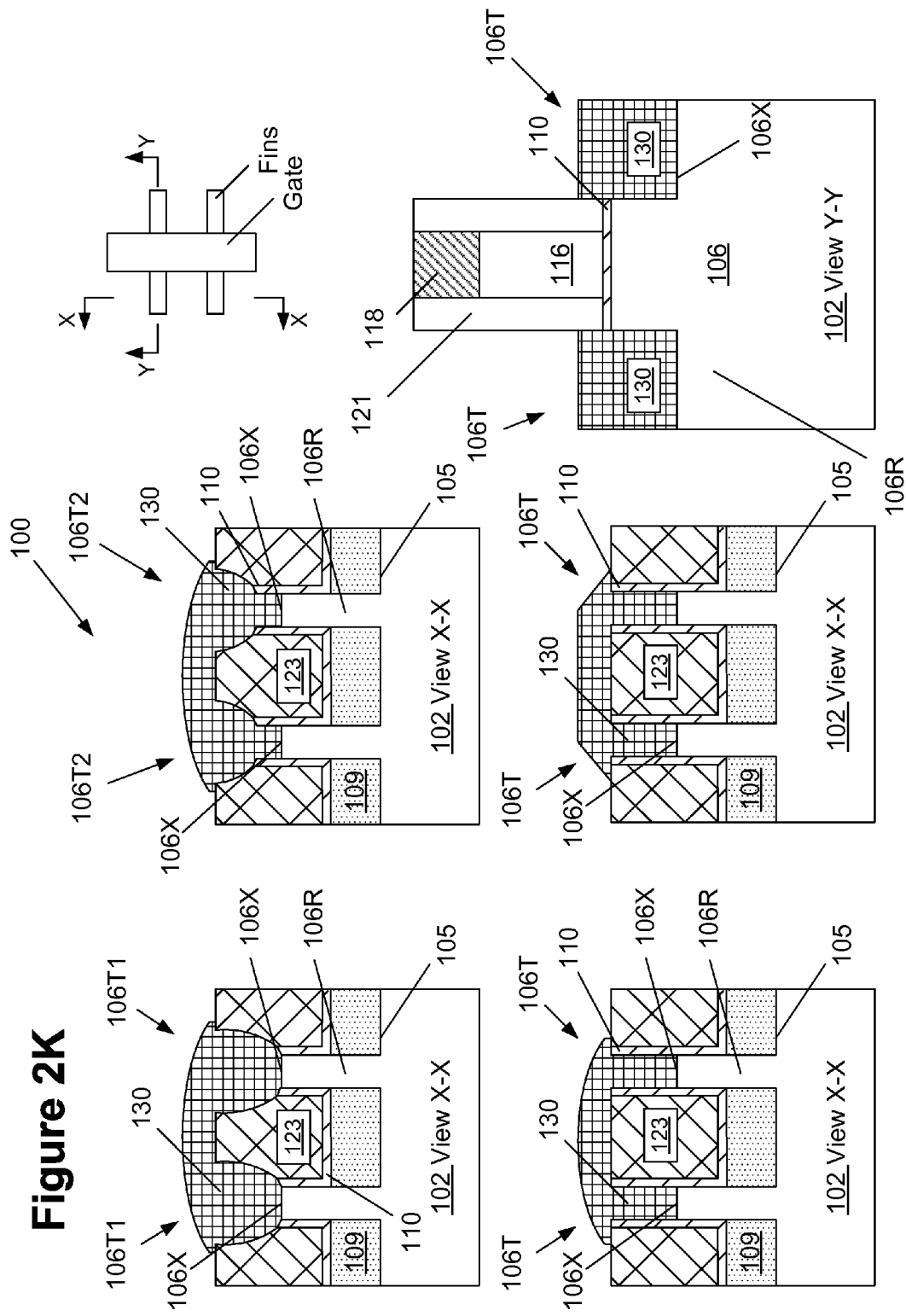

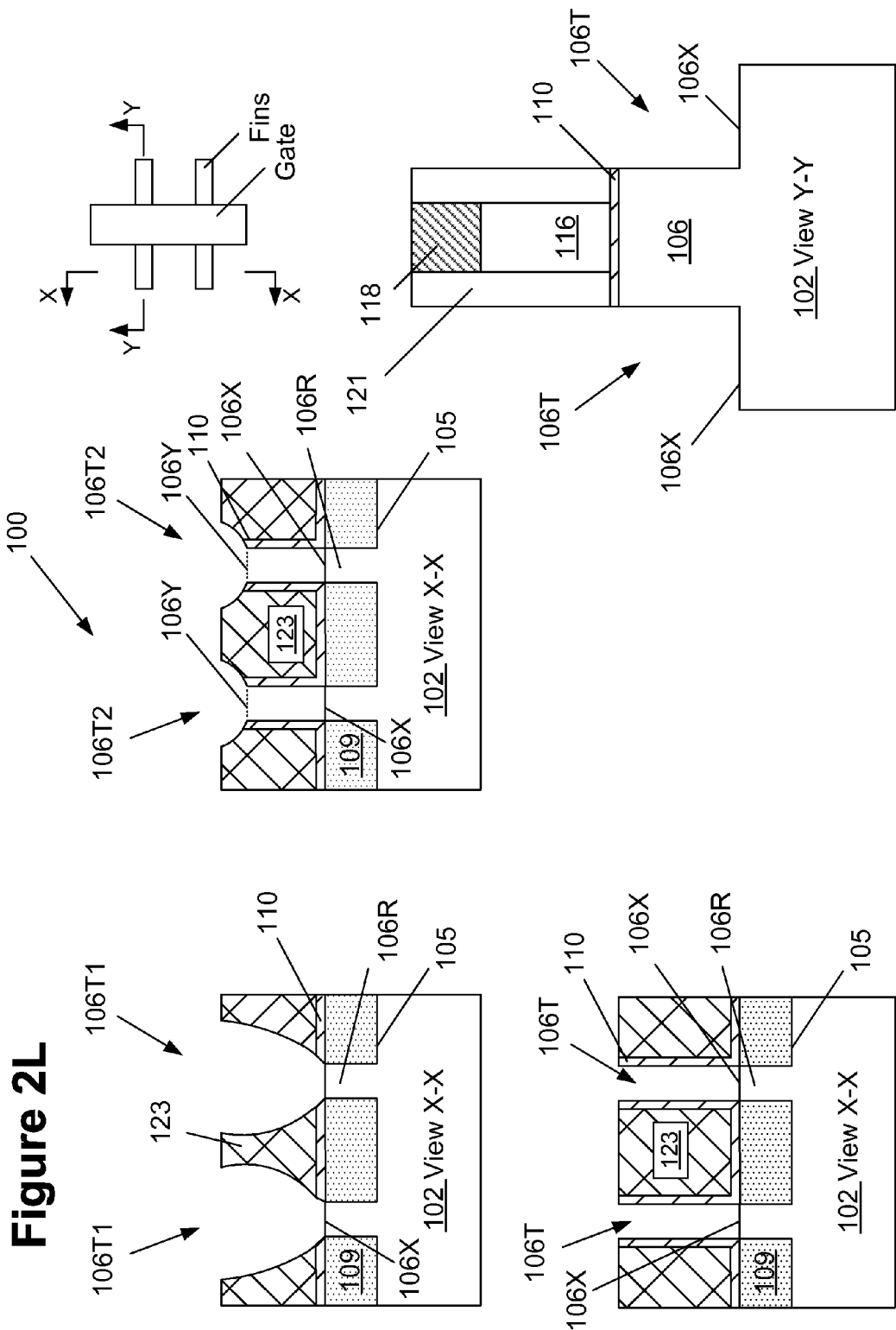

METHODS OF FORMING EMBEDDED SOURCE/DRAIN REGIONS ON FINFET DEVICES

BACKGROUND OF THE INVENTION

1. Field of the Invention

Generally, the present disclosure relates to the manufacture of semiconductor devices, and, more specifically, to various novel methods of forming embedded source/drain regions on FinFET devices.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

FIG. 1 is a perspective view of an illustrative prior art FinFET semiconductor device 10 that is formed above a semiconductor substrate 12 that will be referenced so as to explain, at a very high level, some basic features of a traditional FinFET device. In this example, the FinFET device 10 includes three illustrative fins 14, a gate structure 16, sidewall spacers 18 and a gate hard mask 20. The gate structure 16 is typically comprised of a layer of insulating material (not separately shown), e.g., a layer of high-k insulating material or silicon dioxide, and one or more conductive material layers (e.g., metal and/or polysilicon) that serve as the gate electrode for the device 10. The fins 14 have a three-dimensional configuration: a height 14H, a width 14W and an axial length 14L. The direction of current travel when the device 10 is operational, i.e., the gate length (GL) of the device 10, corresponds to the direction of the axial length 14L of the fins 14. The portions of the fins 14 covered by the gate structure 16 is the channel region of the FinFET device 10, while the portions of the fins 14 that are positioned outside of the spacers 18 are the source/drain regions of the device 10. The fins 14 are typically formed by performing an etching process through a patterned hard mask layer to define a plurality of fin-formation trenches 13 in the substrate 12 so as to define the fins 14. Thereafter, a layer of insulating material 22, e.g., silicon dioxide, is blanket-deposited across the substrate 12 such that it overfills the trenches 13. Several process operations are performed (chemical mechanical polishing (CMP) and recess etching) so as to reduce the as-deposited thickness of the layer of insulating material 22 and thereby result in the recessed layer of insulating material 22 depicted in FIG. 1. The recessed layer of insulating material 22 has a recessed upper surface 22R that is at a desired height level within the trenches 13 so as to establish the final approximate fin height for the fins 14 of the device 10. Note that, in the typical prior art process flow, the layer of insulating material 22 is recessed within the trenches 13 prior to the formation of any materials for the gate structure 16.

Eventually, electrical contacts will be formed to contact the source/drain regions of the device 10. Ideally, the contact area in the source/drain regions will be as large as possible and exhibit as low an electrical contact resistance as possible. In some traditional process flows, additional epi semiconductor material may be formed on the portions of the fins 14 in the source/drain regions of the device 10 to facilitate making the formation of such contacts. There are various ways in which this epi semiconductor material may be formed. In one example, referred to as "unmerged epi," the intent is to form a limited amount of epi semiconductor material on each of the individual fins without the epi material contacting epi material on adjacent fins. Some problems with this unmerged epi approach is that the volume of epi material that is formed on each fin is very limited due to the very tight fin pitch used in advanced devices, and the contact resistance tends to be higher than is desired due to the limited volume of epi material and the limited contact area. Another problem with the unmerged epi approach is that it is simply very difficult to only grow epi material on individual fins without contacting the epi material on adjacent fins because of the above-noted very small fin pitches used in advanced devices. Another approach is referred to as "merged epi." As the name implies, in the merged epi approach, the epi material is grown such that the epi material on adjacent fins merges together so as to form a relatively larger contact area which produced a lower electrical contact resistance. One problem with the merged epi approach is that the epi semiconductor material, if not constrained or limited by other structures, may grow in areas where is it not desired. As a worst-case example, merged epi material on one device may grow laterally to such an extent that it unintentionally spans across an isolation region and contacts the active region or other epi material formed on an adjacent device, thereby creating a conductive path between the two devices that were intended to be electrically isolated from one another. Efforts to form structures that limit such undesirable lateral growth of the epi semiconductor material can involve many complex processing steps and increase the cost of production. Yet another approach that is sometimes employed when forming epi semiconductor material on the portions of the fins 14 that are positioned in the source/drain regions of a FinFET device is referred to as an "embedded epi." In the embedded epi approach, after the fins 14 are formed, the portions of the fins positioned above the upper surface 22R of the layer of insulating material 22 are removed, i.e., the upper surface of the remaining portion of the fin is positioned at a level that is slightly below the surface 22R. Thereafter, epi semiconductor material is grown on this exposed upper surface of the remaining portion of the fin. In the embedded epi approach, the final epi material may be formed in an "unmerged" or "merged" condition.

The present disclosure is directed to novel methods of forming embedded source/drain regions on FinFET devices and the resulting devices that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming embedded source/drain regions on FinFET devices. One illustrative method disclosed herein includes, among other things, forming a sidewall spacer adjacent a gate structure, after forming the sidewall spacer, forming a layer of insulating material adjacent the spacer and above the portions of the fin positioned laterally outside the spacer, the layer of insulating material having an upper surface that is substantially planar with an upper surface of the gate cap layer, and performing a first recess etching process on the layer of insulating material to define a recessed layer of insulating material having a recessed upper surface, wherein at least an upper surface of the fin is exposed after the first recess etching process is completed. In this example, the method further includes performing at least one second etching process to remove at least a portion of the fin and thereby define a recessed fin and a recessed fin trench positioned above the recessed fin and performing at least one epitaxial deposition process to form at least one epitaxial semiconductor material that is at least partially positioned in the recessed fin trench.

BRIEF DESCRIPTION OF THE DRAWINGS

The disclosure may be understood by reference to the following description taken in conjunction with the accompanying drawings, in which like reference numerals identify like elements, and in which:

FIGS. 2A-2L depict various illustrative novel methods disclosed herein for forming embedded source/drain regions on FinFET devices.

Figure 1:
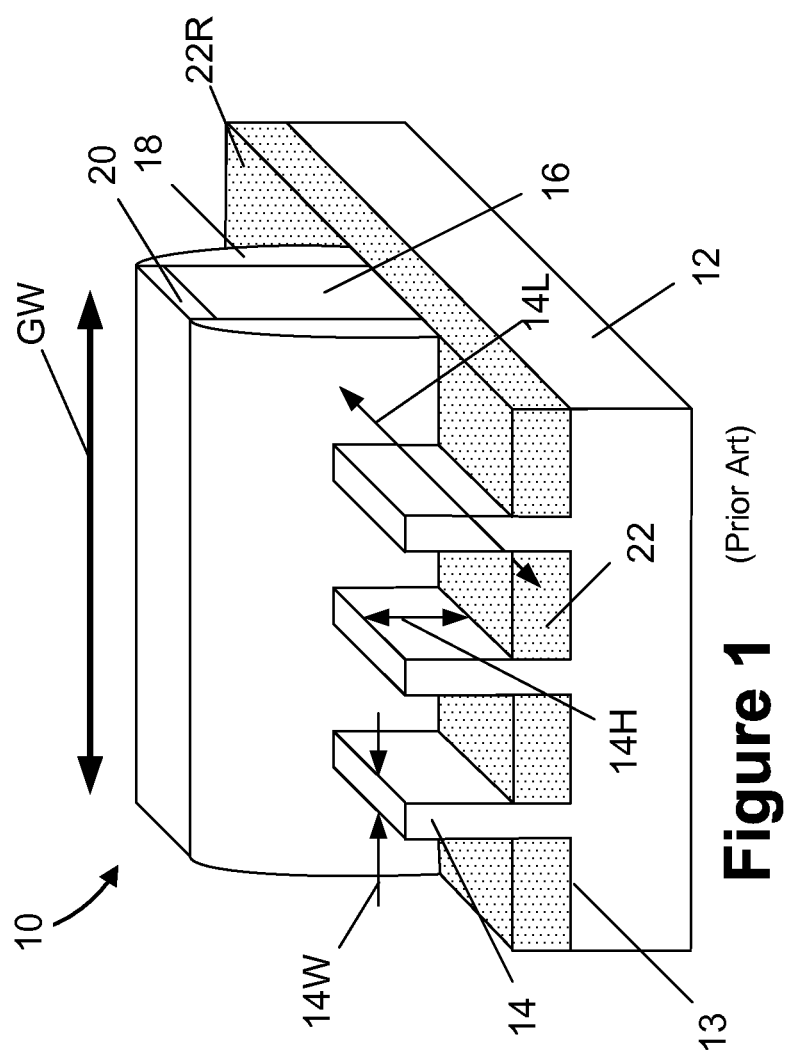
FIG. 1 depicts an illustrative prior art FinFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the integrated circuit devices 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

FIGS. 2A-2L present various views of one illustrative embodiment of a FinFET device 100 that may be formed using the methods disclosed herein. The drawings also include a simplistic plan view of the device 100 (in the upper right corner) that depicts the location where various cross-sectional views depicted in the following drawings will be taken. More specifically, the view "X-X" is a cross-sectional view taken through a source/drain region of the device 100 in a direction that is transverse to the long axis of the fins, i.e., in a direction that is substantially parallel to the gate width direction of the device 100, and the view "Y-Y" is a cross-sectional view that is taken through the long axis of a fin transverse to the long axis of the gate structure, i.e., in the gate-length or current transport direction of the device 100.

In the examples depicted herein, the FinFET device 100 will be formed in and above a semiconductor substrate 102. The substrate 102 may have a variety of configurations, such as a silicon-on-insulator (SOI) or silicon-germanium-on-insulator (SGOI) that includes a bulk semiconductor layer, a buried insulation layer and an active layer. Alternatively, the substrate may have a simple bulk configuration. The substrate 102 may be made of silicon or it may be made of materials other than silicon. Thus, the terms "substrate" or "semiconductor substrate" should be understood to cover all semiconducting materials and all forms of such materials.

Figure 2A:
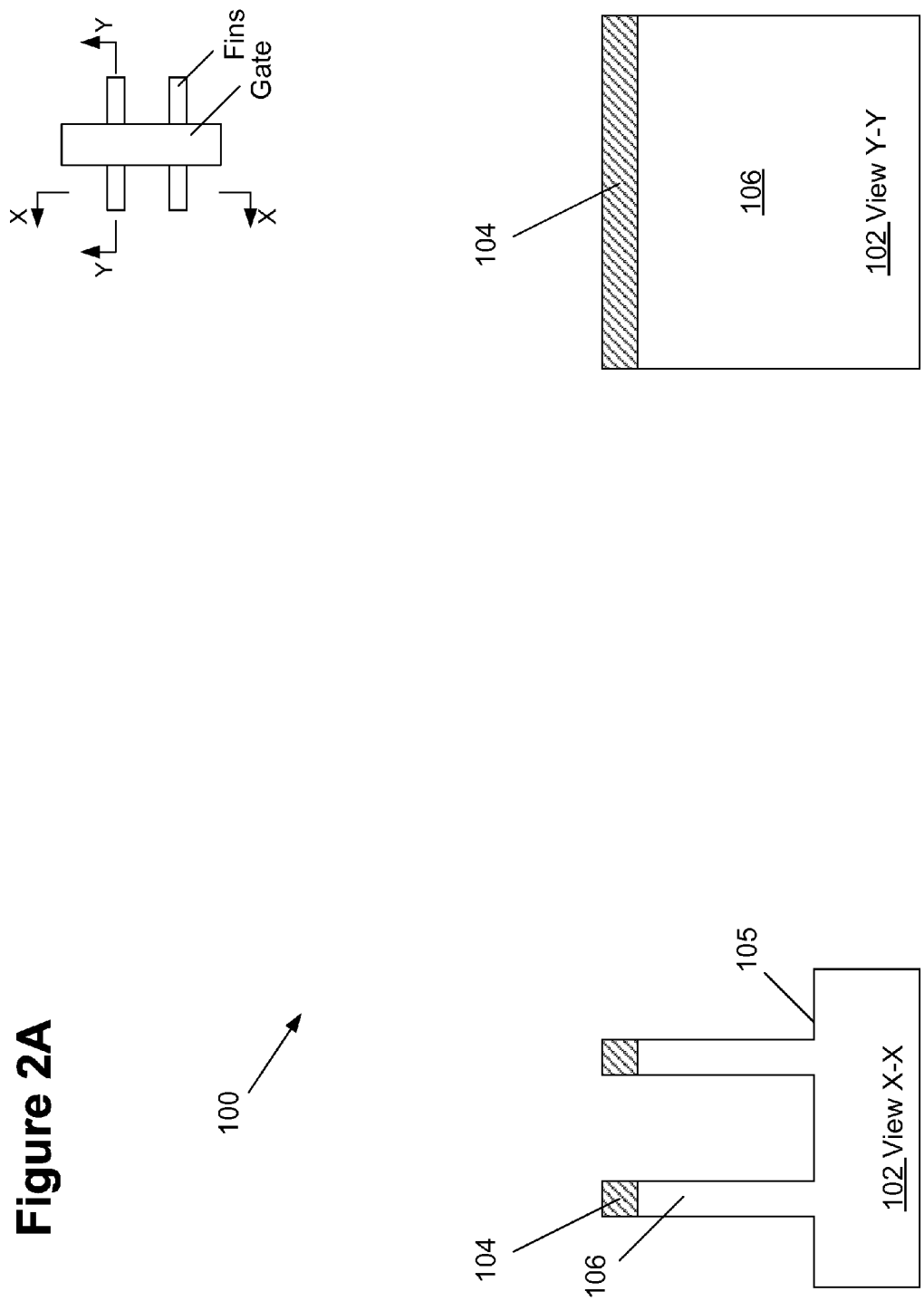

FIG. 2A depicts the device 100 at a point in fabrication wherein several process operations have been performed. First, a patterned etch mask 104, e.g., a combination of a silicon dioxide layer (e.g., a pad oxide) and a silicon nitride layer (e.g., a pad nitride), was formed above the substrate 102. In some cases, the pad oxide layer (not separately shown) may be omitted if desired. Thereafter, one or more etching processes were performed through the patterned etch mask 104 so as to define a plurality of fin-formation trenches 105 in the substrate 102. This results in the formation of a plurality of fins 106. Current-day advanced FinFETs typically feature fin pitches around 40 nm and below, and fin formation is based on well-known sidewall image transfer processes. The illustrative FinFET device 100 disclosed herein will be depicted as being comprised of two illustrative fins 106. However, as will be recognized by those skilled in the art after a complete reading of the present application, the methods and devices disclosed herein may be employed when manufacturing FinFET devices having any number of fins. The fins 106 extend laterally into and out of the drawing page in the current transport direction of the device 100 and into what will become the source/drain regions of the device 100.

With continuing reference to FIG. 2A, the overall size, shape and configuration of the fin-formation trenches 105 and the fins 106 may vary depending on the particular application. The depth and width of the fin-formation trenches 105 may vary depending upon the particular application. In one illustrative embodiment, based on current-day bulk technology, the overall depth (relative to the upper surface of the substrate 102) of the trenches 105 may be about 100 nm. In the illustrative examples depicted in the attached figures, the trenches 105 and the fins 106 will be simplistically depicted as having generally rectangular portions and sections. In an actual real-world device, the sidewalls of the fin-formation trenches 105 may be somewhat tapered, although such tapering is not depicted in the drawings. Thus, the size and configuration of the trenches 105 and the fins 106, and the manner in which they are made, should not be considered a limitation of the present invention. For ease of disclosure, only the substantially rectangular-shaped trenches 105 and fins 106 having a substantially rectangular-shaped cross-sectional configuration will be depicted in the drawings.

Figure 2B:
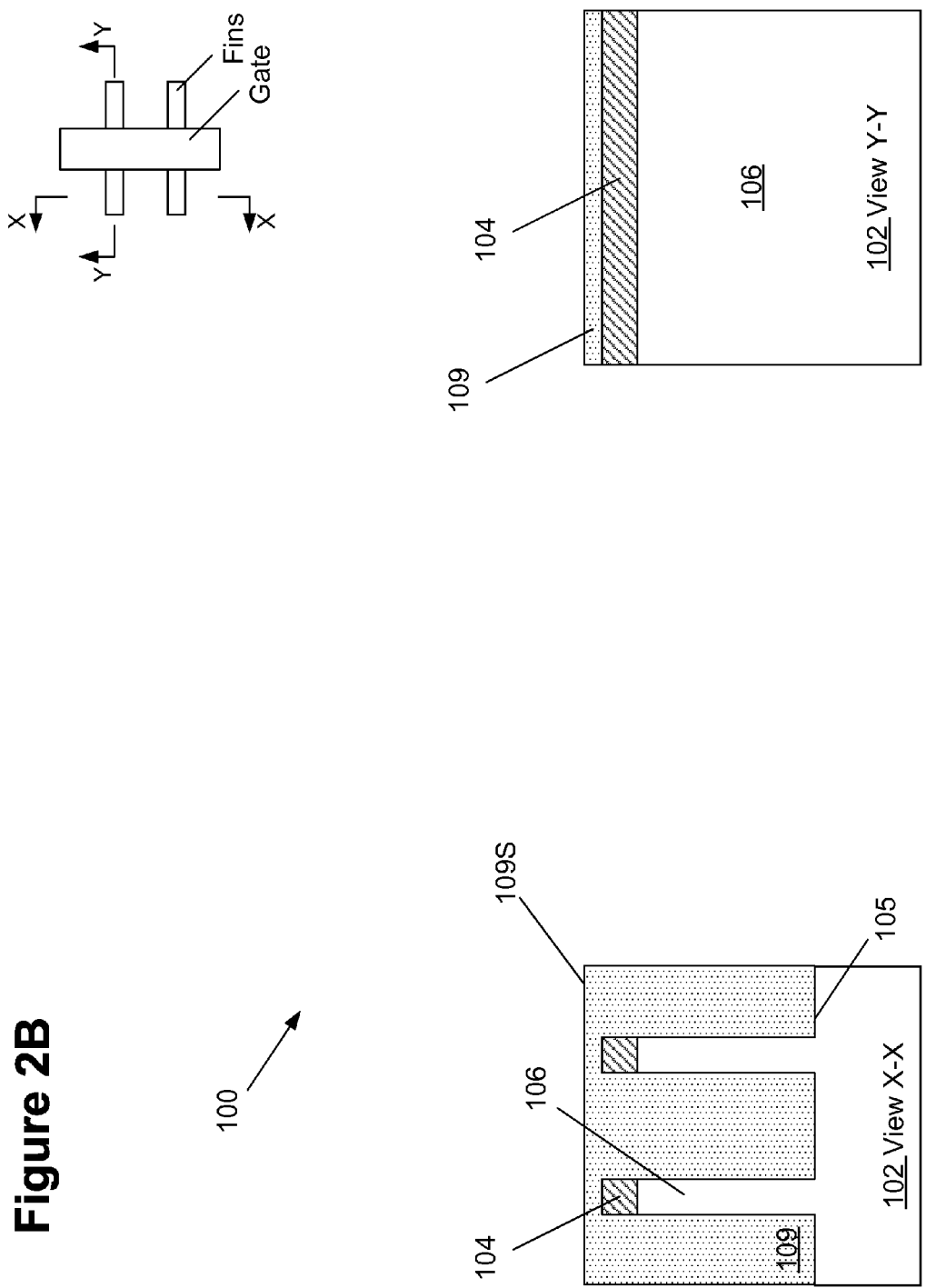

FIG. 2B depicts the FinFET device 100 after a layer of insulating material 109 was formed so as to over-fill the trenches 105 between the fins 106. That is, the layer of insulating material 109 is formed such that its as-deposited upper surface 109S is positioned above the patterned masking layer 104. The layer of insulating material 109 may be comprised of, for example, silicon dioxide, a HARP oxide, HDP oxide, flowable oxide, etc.

Figure 2C:
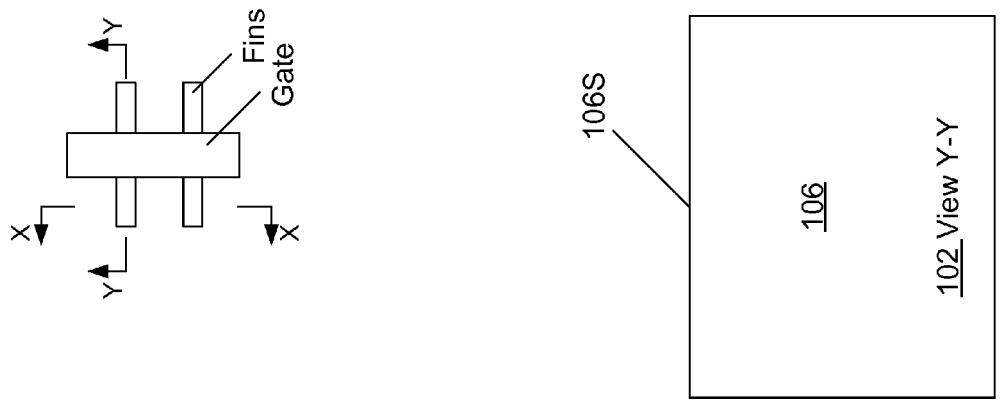
Figure 2C:
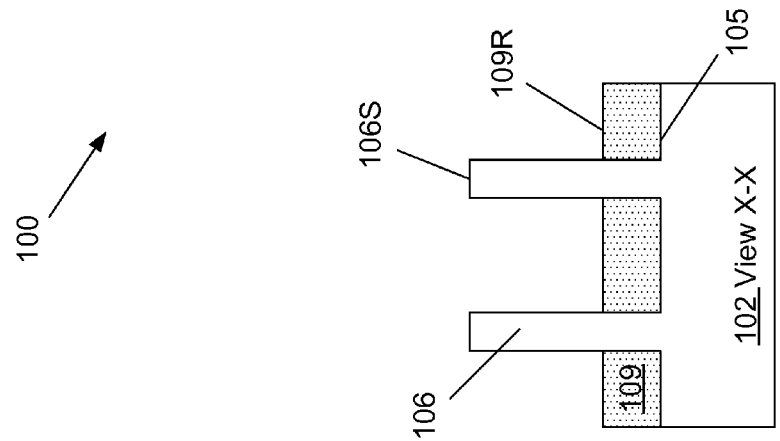

FIG. 2C depicts the FinFET device 100 after several process operations were performed. In one illustrative process flow, one or more CMP processes were performed to remove portions of the layer of insulating material 109 and the patterned hard mask layer 104. These processes result in the exposure of the upper surface 106S of the fins 106 which is now planar with the planarized layer of insulating material 109. Thereafter, a recess etching process was performed to recess the layer of insulating material 109 such that it has a recessed upper surface 109R that exposes an upper portion of the fins 106.

The inventions disclosed herein may be employed when forming gate structures that are manufactured using so-called "gate-first" or "replacement-gate" manufacturing techniques. For purposes of explaining the inventions herein, an illustrative replacement gate process flow will be depicted. Accordingly, FIG. 2D depicts the device 100 after layers of material for a sacrificial gate insulating layer 110, a sacrificial gate material 116 and a gate cap (hard mask) layer 118 were sequentially deposited on the device 100. In general, the sacrificial gate insulation layer 110 may be a layer of silicon dioxide, the sacrificial gate material 116 is comprised of a material such as polysilicon or amorphous silicon, while the gate cap layer 118 is comprised of a material such as silicon nitride. The thickness of these materials may vary depending upon the particular application. Note that, in some cases, a CMP process may be performed on the sacrificial gate material 116 to planarize its upper surface prior to forming the gate cap layer 118.

FIG. 2E depicts the device 100 after several process operations were performed. First, the sacrificial gate material 116 and the gate cap layer 118 were etched above a section of the fins 106 using traditional masking and etching techniques. In one embodiment, the sacrificial gate insulating layer 110 serves as an etch stop when etching at least the sacrificial gate material layer 116. Thereafter, simplistically depicted sidewall spacers 121 were formed adjacent the patterned sacrificial gate material 116 and the patterned gate cap layer 118. The sidewall spacers 121 were formed by depositing a layer of spacer material (e.g., silicon nitride) and thereafter performing an anisotropic etching process. The spacers 121 may be of any desired thickness.

FIG. 2F depicts the device 100 after several process operations were performed prior to conventional source/drain epi formation. First, another layer of insulating material 123, such as silicon dioxide, was blanket-deposited above the device 100 such that its as-deposited upper surface was positioned above the upper surface of the gate cap layer 118. Then, one or more CMP processes were performed to planarize the upper surface 123S of the insulating material 123 with the upper surface of the gate cap layer 118.

FIG. 2G depicts the FinFET device 100 after a timed, recess etching process, such as a COR (Chemical Oxide Removal) process or a Siconi etch process, was performed on the layer of insulating material 123 (and the sacrificial gate insulating layer 110, if it is still present on top of the fins) until such time as the upper surface 106S of the fins 110 are exposed. As depicted, the recessed layer of insulating material 123 has a recessed upper surface 123R that is substantially planar with the upper surface 106S of the fins 106. In some cases, the recessed upper surface 123R may be below the level of the upper surface 106S of the fins 106 so as to thereby expose a portion of the sidewalls of the fins 106.

FIG. 2H depicts the FinFET device 100 after another timed, recess etching process was performed to remove portions of the fins 106 and thereby define a plurality of recessed fins 106R having a recessed upper surface 106X that results in a recessed fin trench 106T in the insulating materials positioned above the recessed fins 106R. In one embodiment, the vertical depth of the fin trench 106T may correspond approximately to the final desired fin height for the finished device, e.g., about 30-50 nm. A variety of etching processes and techniques may be performed to achieve a desired configuration for the recessed fin trench 106T. In the embodiment shown in the lower left of FIG. 2H, an anisotropic etching process alone was performed to remove an upper portion of the fins 106 selectively relative to the surrounding insulating materials 110 and 123. In this embodiment, the recessed fin trench 106T will have a cross-sectional configuration that corresponds approximately to the outer surface of the removed portion of the fin 106. In the depicted example in the lower left of FIG. 2H, the recessed fin trench 106T has a substantially rectangular cross-sectional profile. If the removed portion of the fin 106 had tapered sidewalls, then the recessed fin trench 106T would have a substantially trapezoidal cross-sectional profile.

As referenced above, other etching schemes may be employed to achieve a desired configuration for the recessed fin trench 106T. For example, with reference to the view X-X shown in the upper left of FIG. 2H, a timed, anisotropic, fin removal etching process may be initially performed to remove a portion of the fin 106 thereby resulting in the recessed fin trench 106T shown in the lower left of FIG. 2H. Thereafter, an etching process designed to remove insulating materials, such as an HF-based etching process, having at least some isotropic characteristics, and perhaps a combination of anisotropic and isotropic characteristics, was performed on the insulating materials 123/110 to produce the recessed fin trench 106T1 having a generally U-shaped cross-sectional profile, wherein the width of the opening of the recessed fin trench 106T1 may be adjusted by adjusting the etching process.

The view X-X in the middle of FIG. 2H depicts yet another embodiment of an etching scheme that may be employed in the inventions described herein to form a recessed fin trench 106T2. In this example, a partial fin recess will be initially formed, followed by performing an etching process on the insulating materials 123/110, followed by performing a final fin removal recessing etch process. More specifically, a first timed, anisotropic etching process may be initially performed to remove a portion of the fin 106 such that, after this first anisotropic etching process, the fin 106 has a recessed upper surface that is positioned approximately at the level depicted by the dashed lines 106Y. Thereafter, an etching process, such as an HF-based etching process, having at least some isotropic characteristics, and perhaps a combination of anisotropic and isotropic characteristics, was performed on the insulating materials 123/110 to produce the U-shaped portion of the recessed fin trench 106T2. Next, a second timed, anisotropic, fin removal etching process may be performed to remove an additional portion of the fin 106 thereby resulting in the recessed fin trench 106T2, such that the final recessed fin has a recessed upper surface 106X that is located at approximately the same position as in the embodiment shown in the lower left of FIG. 2H. As before, the width of the opening of the recessed fin trench 106T2 may be adjusted by adjusting the etching process.

FIG. 2I depicts the FinFET device 100 after one or more selective epitaxial deposition processes were performed to grow epi semiconductor material 130 in the recessed fin trenches 106T, 106T1 and 106T2. In this embodiment, the epi material 130 is formed such that it slightly overfills the trenches 106T, 106T1 and 106T2. The epi semiconductor material 130 may be any type of semiconductor material, e.g., silicon, silicon germanium, silicon carbon, germanium, an III-V semiconductor material, etc.

FIG. 2J depicts the FinFET device 100 after one or more epitaxial deposition processes were performed to grow epi semiconductor material 130 in the recessed fin trenches 106T, 106T1 and 106T2. In this embodiment, the epi material 130 is formed such that it significantly overfills the trenches 106T, 106T1 and 106T2. Also depicted in FIG. 2J (view X-X in middle at bottom) is an embodiment wherein the epi material 130 is grown such that it has a substantially diamond-shaped cross-sectional configuration above the upper surface of the layer of insulating material 123 due to the crystallographic orientation of the sidewalls of the fins 106. In the embodiments shown in FIGS. 2I and 2J, the epi material 130 is formed such that it is in an unmerged condition. If desired, the epi growth process could be continued such that the epi material 130 is in a final merged condition, as shown in FIG. 2K.

FIG. 2L depicts an embodiment wherein, in forming the fin trenches 106T, 106T1 and 106T2, the fins 106 were recessed down to the top of the isolation material 109, i.e., the fins were fully recessed down to the isolation material 109. At that point, the epi material 130 (not shown in FIG. 2L) may be formed on the fully recessed fins in a "flush fill" type configuration (as depicted in FIG. 2I), in an "overfilled but unmerged" configuration (as depicted in FIG. 2J) or in a "merged epi" configuration (as depicted in FIG. 2K).

At this point in the process flow, traditional manufacturing operations may be performed to complete the manufacture of the device. For example, after another round of blanket insulator depositions and planarization, the gate cap layer 118 and the sacrificial gate materials 116, 110 may be removed and a replacement gate structure (not shown) including a high-k gate insulation layer and one or more layers of metal, as well as a gate cap layer (not shown) may be formed in the replacement gate cavity between the spacers 121.

After a complete reading of the present application, those skilled in the art will appreciate that the various inventions disclosed herein provide device designers with additional degrees of freedom as to the selection and formation of several different source/drain profiles so as to simultaneously minimize external resistance in the context of a readily scalable technology that may be particularly useful for highly scaled high performance SRAMs. Other applications and advantages may also be achieved using the methods disclosed herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming embedded source/drain regions on a FinFET device comprised of a fin, a gate structure positioned around a section of said fin and a gate cap layer positioned above said gate structure, the method comprising:

forming a sidewall spacer adjacent said gate structure;

after forming said sidewall spacer, forming a layer of insulating material adjacent said sidewall spacer and above portions of said fin positioned laterally outside said sidewall spacer, said layer of insulating material having an upper surface that is substantially planar with an upper surface of said gate cap layer;

performing a first recess etching process on said layer of insulating material to define a recessed layer of insulating material having a recessed upper surface, wherein at least an upper surface of said fin is exposed after said first recess etching process is completed;

performing at least one second etching process to remove at least a portion of said fin and thereby define a recessed fin and a recessed fin trench positioned above said recessed fin, said recessed fin trench having said recessed layer of insulating material located adjacent opposite sides of said recessed fin trench; and performing at least one epitaxial deposition process to form at least one epitaxial semiconductor material that is at least partially positioned in said recessed fin trench.

2. The method of claim 1, wherein said forming said layer of insulating material comprises:

depositing said layer of insulating material such that it has an as-deposited upper surface that is positioned above said upper surface of said gate cap layer; and performing a planarization process on said layer of insulating material until the planarized upper surface of said layer of insulating material is substantially planar with said upper surface of said gate cap layer.

3. The method of claim 1, wherein said layer of insulating material is comprised of silicon dioxide.

4. The method of claim 1, wherein said performing said first recess etching process on said layer of insulating material comprises performing a timed, anisotropic etching process.

5. The method of claim 1, wherein said performing said at least one second etching process comprises performing a single etching process that selectively removes a portion of said fin relative to surrounding materials.

6. The method of claim 1, wherein said performing said at least one second etching process comprises performing a fin removal etching process that selectively removes a portion of said fin relative to surrounding materials and thereafter performing an insulating material removal etching process to remove a portion of said layer of insulating material.

7. The method of claim 6, wherein said performing said at least one second etching process further comprises performing another fin removal etching process that selectively removes a portion of said fin relative to surrounding materials.

8. The method of claim 1, wherein said recessed fin trench has a cross-sectional profile that is one of a substantially rectangular, substantially trapezoidal, rounded or a combination of any of the foregoing.

9. The method of claim 1, wherein said at least one selective epitaxial semiconductor material is comprised of at least one of silicon, germanium, silicon-germanium or a III-V material.

10. The method of claim 1, wherein said at least one selective epitaxial deposition process is performed such that a portion of said layer of insulating material adjacent an opening of said recessed fin trench is clear of said at least one epitaxial semiconductor material.

11. The method of claim 1, wherein said at least one selective epitaxial deposition process is performed such that said at least one epitaxial semiconductor material overfills said recessed fin trench and such that a portion of said at least one epitaxial semiconductor material is positioned above said layer of insulating material located adjacent an opening of said recessed fin trench.

12. The method of claim 11, wherein said portion of said at least one epitaxial semiconductor material positioned above said layer of insulating material located adjacent said opening of said recessed fin trench has one of a rounded or triangular shaped upper surface.

13. The method of claim 1, wherein said performing said at least one second etching process to remove at least a portion of said fin and thereby define said recessed fin and said recessed fin trench positioned above said recessed fin comprises performing said at least one second etching process so as to remove substantially all of said fin positioned at a level above a level of an upper surface of a local isolation material positioned in a trench adjacent said fin.

14. The method of claim 1, wherein said at least one selective epitaxial deposition process is performed such that said at least one epitaxial semiconductor material overfills said recessed fin trench and merges with an epitaxial material formed on an adjacent fin of said FinFET device.

15. The method of claim 1, wherein said at least one selective epitaxial deposition process is performed such that said at least one epitaxial semiconductor material formed on said recessed fin trench does not merge with an epitaxial material formed on an adjacent fin of said FinFET device.

16. A method of forming embedded source/drain regions on a FinFET device comprised of a fin, a gate structure positioned around a section of said fin and a gate cap layer positioned above said gate structure, the method comprising:

forming a plurality of fin-formation trenches in a semiconductor substrate to thereby define a fin having an upper surface forming a first layer of insulating material in said trenches adjacent said fin, said first layer of insulating material having an upper surface that exposes an upper portion of said fin;

performing at least one process operation to form a gate structure around a section of said upper portion of said fin and a gate cap layer positioned above said gate structure, wherein said gate structure is positioned above said upper surface of said first layer of insulating material;

forming a sidewall spacer adjacent said gate structure;

after forming said sidewall spacer, forming a second layer of insulating material adjacent said sidewall spacer and above portions of said fin positioned laterally outside said sidewall spacer, said second layer of insulating material having an upper surface that is substantially planar with an upper surface of said gate cap layer;

performing a first recess etching process on said second layer of insulating material to define a recessed second layer of insulating material having a recessed upper surface, wherein at least said upper surface of said fin is exposed after said first recess etching process is completed;

performing at least one second etching process to remove at least a portion of said fin and thereby define a recessed fin and a recessed fin trench positioned above said recessed fin, said recessed fin trench having at least said recessed second layer of insulating material located adjacent opposite sides of said recessed fin trench; and performing at least one epitaxial deposition process to form at least one epitaxial semiconductor material that is at least partially positioned in said recessed fin trench.

17. The method of claim 16, wherein said forming said second layer of insulating material, comprises:

depositing said second layer of insulating material such that it has an as-deposited upper surface that is positioned above said upper surface of said gate cap layer; and performing a planarization process on said second layer of insulating material until the planarized upper surface of said second layer of insulating material is substantially planar with said upper surface of said gate cap layer.

18. The method of claim 16, wherein said first and second layers of insulating material are each comprised of silicon dioxide.

19. The method of claim 16, wherein said performing said first recess etching process on said second layer of insulating material comprises performing a timed, anisotropic etching process.

20. The method of claim 16, wherein said performing said at least one second etching process comprises performing a single etching process that selectively removes a portion of said fin relative to surrounding materials.

21. The method of claim 16, wherein said performing said at least one second etching process comprises performing a fin removal etching process that selectively removes a portion of said fin relative to surrounding materials and thereafter performing an insulating material removal etching process to remove a portion of said layer of insulating material.

22. The method of claim 21, wherein said performing said at least one second etching process further comprises performing another fin removal etching process that selectively removes a portion of said fin relative to surrounding materials.

* * * * *